(12) United States Patent
Chi et al.

(10) Patent No.: US 6,362,012 B1
(45) Date of Patent: Mar. 26, 2002

(54) STRUCTURE OF MERGED VERTICAL CAPACITOR INSIDE SPIRAL CONDUCTOR FOR RF AND MIXED-SIGNAL APPLICATIONS

(75) Inventors: Min-Hwa Chi; Chia-Shiung Tsai, both of Hsin-chu; Yeur-Luen Tu, Taichung, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/798,651

(22) Filed: Mar. 5, 2001

(51) Int. Cl.$^7$ .............................................. H01L 21/00
(52) U.S. Cl. ......................... 438/3; 438/253; 438/396; 257/275; 257/277; 257/531; 257/532; 336/180; 336/181
(58) Field of Search .......................... 438/3, 253, 396; 257/275, 277, 531, 532; 336/180, 182

(56) References Cited

U.S. PATENT DOCUMENTS

| | | | |
|---|---|---|---|
| 5,352,998 A | | 10/1994 | Tanino ........................ 333/247 |
| 5,416,356 A | | 5/1995 | Staudinger et al. .......... 257/531 |
| 5,450,263 A | * | 9/1995 | Desaigoudar et al. ........ 360/110 |
| 5,481,131 A | | 1/1996 | Staudinger et al. .......... 257/531 |
| 5,592,134 A | * | 1/1997 | Ogata et al. ................. 333/185 |
| 5,717,249 A | * | 2/1998 | Yoshikawa et al. .......... 257/728 |
| 5,834,992 A | * | 11/1998 | Kato et al. ................... 333/185 |
| 5,861,647 A | * | 1/1999 | Zhao et al. .................. 257/296 |
| 5,914,508 A | | 6/1999 | Varmazis et al. ............ 257/275 |
| 5,945,892 A | * | 8/1999 | Kato et al. ................... 333/185 |
| 6,072,205 A | | 6/2000 | Yamaguchi et al. ......... 257/277 |
| 6,291,872 B1 | * | 9/2001 | Wang et al. ................. 257/531 |
| 6,294,834 B1 | * | 9/2001 | Yeh et al. .................... 257/758 |

FOREIGN PATENT DOCUMENTS

JP          63-48856    *  3/1988  ................. 257/531

OTHER PUBLICATIONS

J. Burghartz, "Integrated Multilayer RF Passives in Silicon Technology", Topical Meetings on "Silicon Monolithic Integrated Circuit in RF Systems", pp. 141–147. 1998.

(List continued on next page.)

Primary Examiner—John F. Niebling
Assistant Examiner—Jennifer M. Kennedy
(74) Attorney, Agent, or Firm—George O. Saile; Stephen B. Ackerman

(57) ABSTRACT

A new method and structure is provided for the simultaneous creation of inductive and capacitive components in a monolithic substrate. The invention provides a method and structure whereby a vertical spiral inductor is created on the surface of a substrate. Multiple capacitors are created inside the coils of the vertical spiral conductor. A base layer of dielectric is deposited over the surface of a semiconductor substrate, contact plugs are provided in the base layer of dielectric. Multiple layers of dielectric are deposited over the surface of the base layer, layers of coils are created in the multiple layers of dielectric. Vias are provided in the layer of dielectric to interconnect overlying coils of the spiral inductor. An etch stop layer is deposited on the surface of the upper layer of dielectric. At least two openings are etched in the multiple layers of dielectric, these at least two openings are surrounded by the coils of the spiral inductor and align with the contact plugs provided in the base layers. Spacers are formed on the sidewalls of the openings, the bottom electrode layer, dielectric layer and top electrode layer of the at least two capacitors are deposited over the spacers. The openings are filled with a conductive material, the surface of the conductive material is polished down to the surface of the etch stop.

23 Claims, 7 Drawing Sheets

OTHER PUBLICATIONS

M. Stuber et al., "SOI CMOS with High–Performance Passive Components for Analog, RF, and Mixed–Signal Design", Proceedings 1998 IEEE International SOI Conference, pp. 99–100, 1998.

J.N. Burghartz et al., "Integrated RF and Microwave Components in BICMOS Technology", IEEE Trans, on Electron Devices, vol. 43, No. 9, pp. 1559–1570, 1996.

T. Lee, "CMOS RF: No Longer an Oxymoron", pp. 244–247, 1997.

C. Yue et al., "A Study on Substrate Effects of Silicon–Based RF Passive Components", IEEE MTT-S, Intl. Microwave Symposium, vol. 4, pp. 1625–1628, 1999.

J. Burghartz, "Progress in RF Inductors on Silicon–Understanding Substrate Losses", 1998 Intt. Electron Device Meetings, pp. 523–526, 1998.

S. Kamigama et al., "Highly Reliable MIM Capacitor Technology Using Low Pressure CVD–WN Cylinder Storage–Node for 0.12 um–Scale Embedded DRAM", Symposium on VLSI Technology, Paper #4A–4, pp. 39–40, 1999.

K. Kim et al., "A DRAM Technology Using MIM BST Capacitor For 0.15 um DRAM Generation and Beyond", Symposium on VLSI Technology, Paper #4A–1, pp. 33–34, 1999.

D. Edelstein et al., "Seiral and Solenoidal Inductor Structures on Silicon Using Cu–Damascene Interconnects", IEEE International Interconnects, Technology Conf., pp. 18–20, 1998.

* cited by examiner

STRUCTURE OF MERGED VERTICAL CAPACITOR INSIDE SPIRAL CONDUCTOR FOR RF AND MIXED-SIGNAL APPLICATIONS

BACKGROUND OF THE INVENTION (1) Field of the Invention

The invention relates to the fabrication of integrated circuit devices, and more particularly, to a method and structure for the creation of a combined inductor and multiple capacitors structure.

(2) Description of the Prior Art

Developments in the semiconductor industry have over the years been aimed at creating higher performance devices for competitive or lower prices. These developments have resulted in extreme miniaturization of semiconductor devices that has been made possible by numerous and mutually supporting advances in semiconductor processes and by materials that are used for the creation of semiconductor devices, this in combination with new and sophisticated device designs. While most semiconductor devices are aimed at processing digital data, there has also been a broad stream of developments that is aimed at incorporating analog functions into circuits that process digital and analog data or analog data only. It is thereby the objective to create analog data processing devices using digital processing procedures and equipment. One of the major challenges in the creation of analog processing circuitry is that a number of the components that are used for analog circuitry are large in size and are therefore not readily integrated into digital devices that typically have feature sizes in the sub-micron range. The main components that offer a challenge in this respect are capacitors and inductors since both these components are, for typical analog processing circuit, of considerable size. The creation of inductive or capacitive components must therefore emphasize that these components can be created on a relatively small surface area of a semiconductor substrate while using methods and procedures that are well know in the art for the creation of semiconductor devices. The created inductor and capacitor must further be high quality components that can be used in high frequency applications while incurring minimum loss of power.

It is clear that, by combining the creation on one semiconductor monolithic substrate of circuitry that is aimed at the functions of digital and analog data manipulation and storage, a number of significant advantages are achieved. Such advantages include the reduction of manufacturing costs and the reduction of power consumption by the combined functions.

Capacitors and inductors are typically applied in the field of modern mobile communication applications that make use of compact high-frequency semiconductor devices. These devices have over the years continually improved in its performance characteristics, such as lower power consumption, smaller size of the device, wider frequency range of the applications, and lower noise levels. One of the main applications of semiconductor devices in the field of mobile communication is the creation of Radio Frequency (RF) amplifiers and oscillators. RF amplifiers or oscillators contain a number of standard components whereby however a major component of a typical RF amplifier is a tuned circuit that contains inductive and capacitive components. The electrical characteristic of a tuned circuit are such that, dependent on and determined by the magnitudes of its inductive and capacitive components, the tuned circuit forms an impedance that is frequency dependent, thereby enabling the tuned circuit to either be high or a low impedance for signals of a certain frequency. The tuned circuit can therefore either reject or pass and further amplify components of an analog signal based on the operating frequency range of that component. The tuned circuit can in this manner be used as a filter to filter out or remove signals of certain frequencies or to remove noise from a circuit configuration. One commonly used tuned circuit is the LC resonance circuit. One of the problems that is encountered when creating an inductor on the surface of a semiconductor substrate is that the self-resonance caused by the parasitic capacitance between the (spiral) inductor and the underlying substrate as well as the power consumption by parasitic resistances will limit the use of the inductor at high frequencies. As part of the design of such an inductor it is therefore of importance to reduce the capacitive coupling between the created inductor and the underlying substrate and resistive power loss.

Typically, inductors that are created on the surface of a substrate are of a spiral shape whereby the spiral is created in a plane that is parallel with the plane of the surface of the substrate. Conventional methods that are used to create the inductor on the surface of a substrate suffer several limitations. Most high quality factor (Q) inductors form part of a hybrid device configuration or of Monolithic Microwave Integrated Circuits (MMIC's) are created as discrete components, the creation of which is not readily integratable into a typical process of Integrated Circuit manufacturing.

The parameter by which the applicability of an inductor is indicated is the Quality (Q) factor of the inductor. The quality factor Q of an inductor is defined as $Q=Es/El$, wherein Es is the energy that is stored in the reactive (i.e. inductive) portion of the component while El is the energy that is lost as heat in the resistive portion of the component. The higher the Q factor of the component, the closer the resistive value of the component approaches zero. For components, the quality factor serves as a measure of the purity of the reactance (or the susceptance) of the component, which can be degraded due to parasitics. In an actual configuration, there are always some physical resistors that will dissipate power, thereby decreasing the power that can be recovered. The quality factor Q is dimensionless. A Q value of greater than 100 is considered high enough for discrete inductors that are mounted on the surface of Printed Circuit Boards. For inductors that form part of an integrated circuit, the Q value is typically in the low range between about 3 and 20.

In creating an inductor on a monolithic substrate on which additional semiconductor devices are created, the parasitic capacitances that occur as part of this creation also limit the Q that can be achieved for the inductor to a value of 20 or less. This limitation, which is due to the smaller current flowing through the inductor as a consequence of the charging current of the parasitic capacitances, is for many applications not acceptable. Dependent on the frequency at which the LC circuit is designed to resonate, significantly larger values of Q, such as 100 or more, must be available. Prior Art has in this been limited to creating high values of Q as separate units, and in integrating these separate units with the surrounding device functions. This negates the advantages that can be obtained when using the monolithic construction of creating both the inductor and the surrounding devices on one and the same semiconductor substrate. The non-monolithic approach also has the disadvantage that additional wiring is required to interconnect the sub-components of the assembly, thereby again introducing additional parasitic capacitances and resistive losses over the interconnecting wiring network. For many of the applications of the RF amplifier, such as portable battery powered applications, power consumption is at a premium and must therefore be as low as possible. These problems take on even greater urgency with the rapid expansion of wireless applications such as portable telephones and the like. Wireless communications form a rapidly expanding market, where the integration of RF integrated circuits is one of the most important challenges. One of the approaches is to significantly increase the frequency of operation to for instance the range of 10 to 100 GHz. For such high frequencies, the value of the quality factor obtained from silicon-based inductors is significantly degraded. For applications in this frequency range, monolithic inductors have been created using sapphire or GaAs as a base. These inductors have a considerably lower parasitic capacitance and resistance than their counterparts using silicon technology and therefore provide higher frequencies of resonance of the LC circuit. Where more complex applications are required, the need still exists to create inductors using silicon as a substrate for lower cost solutions.

A number of different approaches have been used to incorporate inductors into a semiconductor environment without sacrificing device performance due to substrate losses. One of these approaches has used the selective removing (by etching) of the silicon underneath the inductor (using methods of micro-machining) thereby removing substrate parasitic effects. Another method has been to use multiple layers of metal (such as aluminum) interconnects or of copper damascene interconnects. Other applications use a high resistivity silicon substrate, thereby reducing resistive losses in the silicon substrate, since resistive losses in a substrate form a significant factor in determining the Q value of inductors. Biased wells have been proposed underneath a spiral conductor, this again aimed at reducing resistive losses in the surface of the substrate. All of these approaches have as common objectives to enhance the quality (Q) value of the inductor, to increase the frequency of the LC self-resonance thereby increasing the operating frequency range and to reduce the surface area for the creation of the inductor.

The above overview can be summarized as follows. Capacitors and inductors form valuable passive components that lend themselves to integration with active bipolar or MOS devices for analog functions in VLSI circuits. It is well known in the art that capacitors can be created between layers of polysilicon, poly to polycide or metal or between layers of metal. Capacitors can be either of a planar design, for reasons of process simplicity, or can be three dimensional resulting in a smaller footprint as commonly used in DRAM devices. Conventional implementations of integrated inductors can be of a spiral design that is implemented in a plane with the spiral containing one or more turns in the plane of the inductor or the integrated inductor can be of a multi-layered, metal design. Furthermore, an inductor can be of a solenoid design whereby the spacing between the layers of the solenoid is filled with a dielectric while the consecutive legs of the solenoid are interconnected by vias that are created in the dielectric. A multi-layered spiral inductor can extend as a spiral from the surface on which the inductor is created, the inductor that is created in this manner can for instance be created containing three or more layers.

The previously stated considerations that relate to the design of an inductor can be summarized as follows. Integrated inductors should have a high value for Q while the inductive value must be maximized and the surface area over which the inductor is created must be minimized. Conventional CMOS technology limits the thickness of the metal that can be used for the creation of an inductor, thus limiting the desired reduction in resistive losses. The losses in the inductor are, as previously pointed out, further incurred by losses in the underlying substrate, which are caused by eddy currents (induced by current flowing in the inductor) in the silicon substrate and by current flowing through the inductor to parasitic capacitive components (that are created by the presence of the inductor over the surface of the substrate). Eddy currents can be minimized by increasing the isolation between the inductor and the substrate, by placing alternating regions of implanted n-well and p-well impurities in the silicon substrate underneath the inductor or by reverse biasing p-n junctions underneath the inductor. The energy loss that is incurred by the inductor to substrate capacitive coupling can be minimized by placing a ground shield between the inductor and the substrate, this ground shield can be further provided with holes, wedges, elongated openings (stripes) and the like for reduction of eddy currents that can occur in the ground shield. The solenoid shaped inductor offers the advantage that the eddy currents that are induced by this inductor are of lower value since the current that flows through this inductor essentially flows in a direction that is perpendicular to the surface of the underlying substrate.

The invention addresses the simultaneous creation of an inductor and multiple capacitors. The invention provides a method whereby multiple capacitors that are positioned in a vertical direction on the surface of the supporting substrate are created inside the legs (or inductor coils) of an inductor. In view of the fact that capacitors using silicon technology are typically created using materials that have weak magnetism, the presence of the capacitors inside the legs (or conductor coils) of the inductor will have only minimum effect on the magnetic field inside the inductor. This combination of capacitors that are located inside the legs of an inductor therefore results in significant savings of the surface area of the silicon substrate over which the components are created.

U.S. Pat. No. 5,416,356 (Staudinger et al.) shows a spiral inductor surrounded by a second plate of a capacitor.

U.S. Pat. No. 5,914,508 (Varmazis et al.) discloses a MMIC with an inductor.

U.S. Pat. No. 6,072,205 (Yamaguchi et al.), U.S. Pat. No. 5,352,998 (Tanino) and U.S. Pat. No. 5,481,131 (Staudinger et al.) show related devices.

J. Burghartz, "Integrated multilayer RF Passives in Silicon Technology", Topical meetings on "Silicon monolithic integrated Circuit in RF systems", p. 141–147, 1998.

M. Stuber, M. Megahed, J. Lee, T. Kobayashi, and H. Domyo, "SOI CMOS with high-performance passive components for analog, RF, and mixed-signal design". Proceedings 1998 IEEE International SOI Conference, p.99–100, 1998.

J. N. Burghartz, M. Soyuer, and K. Jenkins, "Integrated RF and Microwave components in BICMOS Technology", IEEE Trans. on Electron Devices, V.43, No.9, p. 1559–1570, 1996.

S. Kamiyama, J. Drynan, Y. Takaishi, and K. Koyama, "Highly reliable MIM capacitor technology using low pressure CVD-WN cylinder storage-node for 0.12 um-scale embedded DRAM", Symposium on VLSI Technology, paper #4A-4, p.39–40, 1999.

K. Kim, et al., "A DRAM technology using MIM BST capacitor for 0.15 um DRAM generation and beyond", Symposium on VLSI Technology, paper #4A-1, p.33–34, 1999.

D. Edelstein and J. Burghartz, "Spiral and solenoidal inductor structures on silicon using Cu-damascene interconnects", IEEE International Interconnects", Technology Conf., p. 1 8–20, 1998.

T. Lee, "CMOS RF: no longer an oxymoron", p.244–247, 1997.

C. Yue and S. Wong, "A study on substrate effects of silicon-based RF passive components", IEEE MTT-S, Intl. Microwave Symposium, Vol. 4, p. 1625–1628, 1999.

J. Burghartz, "Progress in RF inductors on silicon—understanding substrate losses", 1998 Intl. Electron Device Meetings, p. 523–526, 1998.

SUMMARY OF THE INVENTION

A principle objective of the invention is to provide a method of creating multiple capacitors and an inductor with high Q value on the surface of a substrate whereby multiple capacitors are enclosed within the legs of the inductor.

Another objective of the invention is to simultaneously create multiple capacitors and an inductor on the surface of a substrate such that the surface area that is used for the creations of these multiple capacitors and an inductor is minimized.

In accordance with the objectives of the invention a new method and structure is provided for the simultaneous creation of inductive and capacitive components. The invention provides a method and structure whereby a vertical spiral inductor is created on the surface of a substrate. Multiple capacitors are created inside the coils of the vertical spiral conductor. A base layer of dielectric is deposited over the surface of a semiconductor substrate, contact plugs are provided in the base layer of dielectric. Multiple layers of dielectric are deposited over the surface of the base layer, layers of coils are created in the multiple layers of dielectric. Vias are provided in the layer of dielectric to interconnect overlying coils of the spiral inductor. An etch stop layer is deposited on the surface of the upper layer of dielectric. At least two openings are etched in the multiple layers of dielectric, these at least two openings are surrounded by the coils of the spiral inductor and align with the contact plugs provided in the base layers. Spacers are formed on the sidewalls of the openings, the bottom electrode layer, dielectric layer and top electrode layer of the at least two capacitors are deposited over the spacers. The openings are filled with a conductive material, the surface of the conductive material is polished down to the surface of the etch stop layer.

BRIEF DESCRIPTION OF THE DRAWINGS

FIG. 1a shows a single-layer spiral inductor,

FIG. 1b shows a multi-layered spiral inductor with three layers and two via interconnects, and FIG. 1c shows a solenoid-type inductor having three turns.

FIG. 2a shows a three dimensional view of a capacitor that has been created inside a multi-layer spiral inductor, and FIG. 2b shows a cross section of the capacitor of FIG. 2a that has been created inside a multi-layer spiral inductor.

FIG. 4a shows a three dimensional view of two capacitors that have been created inside a multi-layer spiral inductor, and FIG. 4b shows a cross section of the two capacitors of FIG. 4a that have been created inside a multi-layer spiral inductor.

FIG. 5 is a cross section of a silicon substrate on the surface of which an inductor has been created that contains three layers of coils.

FIG. 6 shows the cross section of FIG. 5 after a cavity has been formed for the creation of two capacitors inside the coils of the inductor.

FIG. 7 shows the cross section of FIG. 6 after the walls of the cavity have been covered with spacers.

FIG. 8 shows a cross section after the bottom electrode of the capacitor, the dielectric layer for the capacitor and the top electrode of the capacitor have been deposited.

FIG. 9 shows a cross section after the cavity for the capacitor has been filled and a contact for the top electrode of the capacitor has been created.

DESCRIPTION OF THE PREFERRED EMBODIMENTS

Figure 1A:
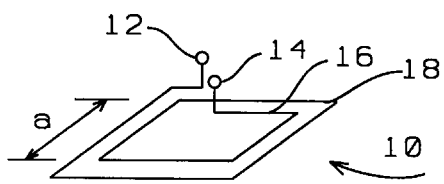
FIGS. 1a, 1b and 1c show conventional inductors, as follows.
Figure 1B:
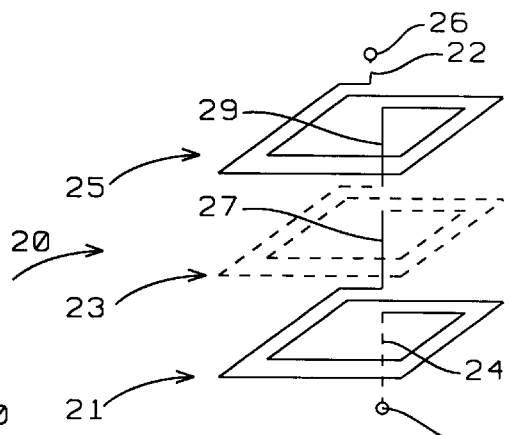
Figure 1C:
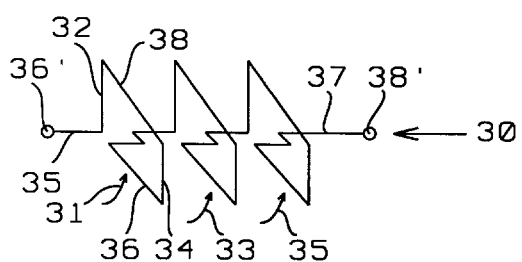

Referring now specifically to FIGS. 1a through 1c, FIG. 1a shows a single-layer spiral inductor 10 that has two loops or turns with a length "a" of the side of the inner of the two loops of the inductor. The inductance (L) of the inductor shown in FIG. 1a is proportional to the inner area that is enclosed by the inner loop of the coils and proportional to the total number of loops (or coils) of the inductor. This can be expressed by the equation that $L \approx \psi \cdot (a^2 \times n)$, where "a" is the length of the inner loop of the spiral inductor as shown in FIG. 1a, "n" is the total number of loops that make up the inductor and "$\psi$" is a constant. Two loops 16 and 18 are highlighted in FIG. 1a, loop 16 is the inner loop that is surrounded by the outer loop 18. The inductor 10 can be entered at input/output (I/O) point 14, the first or inner loop 16 can be passed through after which the outer loop 18 is entered at the completion of which the inductor 10 is excited via I/O point 12. It stands to reason that the inverse direction of passing through the inductor 10 is equally valid. From the equation of the inductance value of the planar spiral inductor of FIG. 1a, it is clear that, in order to increase the value of L, the number of loops (n) of the inductor must be increased or the length (a) of the inner loop of the inductor must be increased.

FIG. 1b shows a multi-layered spiral inductor 20 with three layers 21, 23 and 25 and two via interconnects 27 and 29. Each of the layers 21, 23 and 25 contains two loops within the plane of the layer, since these loops have been explained under FIG. 1a they will not be further highlighted at this time. The via interconnect 27 connects the loops contained in layer 21 with the loops contained in the layer 23, the via interconnect 29 connects the loops contained in layer 23 with the loops contained in the layer 25. Input and output points 26 and 28, which are the two terminals of the inductor 20, can be connected to other circuits by the vias 22 and 24. The layers 21, 23 and 25 are created in planes that are parallel with the surface of the underlying substrate (not shown) over which the inductor 20 is created.

FIG. 1c shows a solenoid-type inductor 30 having three loops 31, 33 and 35. The four members of loop 31 have been highlighted as a first vertical member 32, a first horizontal member 38 that is created on the upper surface of the solenoid inductor 30, a second vertical member 34 and a second horizontal member 36 that is created in the lower surface of the solenoid inductor 30. The vertical members 32 and 34 can be vias or stacked vias. The horizontal members 36 and 38 are metal lines in upper and lower layers of CMOS technology. Further highlighted are I/O interconnect points 36' and 38' of the solenoid inductor 30 which are connected to the body of the inductor 30 be means of interconnect lines 35 and 37.

Figure 2A:
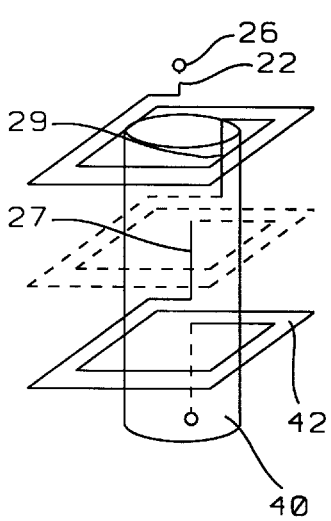
FIGS. 2a and 2b show one capacitor created inside an inductor, as follows.

Referring now specifically to FIG. 2a, there is shown a three dimensional view of a capacitor 40 that has been created inside a multi-layer spiral inductor 42. Inductor 42 is of similar design as the previously highlighted multi-layer spiral inductor of FIG. 1b and therefore does not need to be further detailed at this time. The capacitor 40 is created after the inductor 42, therefore the process of the creation of the capacitor must use low temperatures (i.e. less than 450 degrees C.) and must be compatible with CMOS back-end-of-line (BEOL) processing. It must thereby be observed that most dielectric and electrode materials that are used for the creation of the capacitor (e.g. TiN, W, Al, oxide, and the like) are weak magnetic fields materials. From this follows that the magnetization induced inside capacitive materials by the magnetic field of the inductor is very small. Weak magnetic materials include diamagnetic materials (e.g. copper, germanium, solver and gold, which have a small negative magnetic susceptibility of about $-10^{-5}$) and para-magnetic materials (e.g. aluminum, titanium, tungsten which have a small positive magnetic susceptibility of about $+10^{-5}$). The total magnetic field inside the material of the capacitor is therefore almost the same as if the capacitor does not exist (the surrounding inductor does not "feel" the existence of the capacitor or capacitors that are present inside the inductor).

Figure 2B:
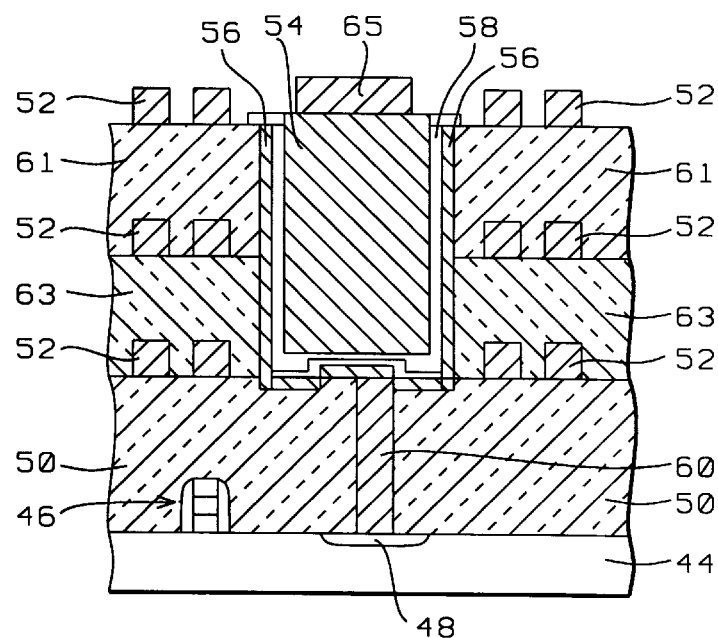

FIG. 2b shows a cross section of the capacitor of FIG. 2a that has been created inside a multi-layer spiral inductor. The various elements that are shown in cross-section in FIG. 2b are:

44 is a p-type substrate over the surface of which the inductor 42 and the capacitor 40 are created
46 is a MOS transistor that has been created on the surface of substrate 44
48 is a point of electrical contact, usually a p⁺ region or a n⁺ region, in the surface of substrate 44 to which the bottom electrode of the capacitor 40 is connected
50 is a layer of dielectric over the surface of which the capacitor 40 and the inductor 42 are created
52 are the coils of the inductor 42
54 is the top electrode of the capacitor 40
56 us the bottom electrode of the capacitor 40
58 is the dielectric of the capacitor 40
60 is the interconnect via between the bottom electrode 56 of capacitor 40 and the point of electrical contact 48 in the surface of substrate 44
61 and 63 are two overlying layers of dielectric that partially embed the coils 52 of the inductor 42, and
65 is a conducting material that is connected to the top plate 54 of capacitor 40.

The advantages and disadvantages that apply to the inductor-capacitor construction as shown in FIGS. 2a and 2b have previously been highlighted and are summarized as follows:

the surface areas over which the capacitor and the inductor have been created are merged, thus saving surface area of the silicon substrate over which these components are created it is easy to connect the created inductor and capacitor in series or in parallel for integration of these components into adjacent electronic circuitry, for instance an LC oscillator as a significant drawback must be noted that eddy currents are induced by the current flowing in the inductor 42 on the walls of the capacitor 40. These eddy currents result in significant energy losses due to resistance on the wall or on the surface of the bottom electrode of the capacitor. These energy losses are additional to the energy losses that have previously been highlighted, incurred in the surface of the underlying silicon substrate.

Figure 3:
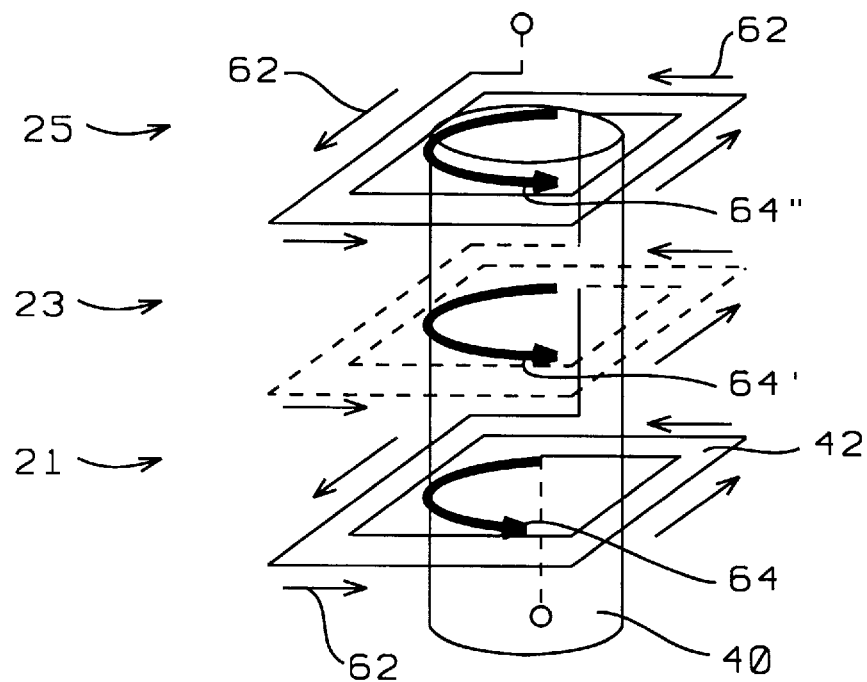
FIG. 3 shows the presence of eddy currents in the capacitor of the first embodiment of the invention.

The eddy currents that are induced on the walls of the capacitor are shown in FIG. 3. The elements shown in FIG. 3 are:

inductor 42 with layers 21, 23 and 25
capacitor 40
62, current flowing through inductor 42
64, 64' and 64", eddy currents induced on the walls of the capacitor 40 by respectively layers 21, 23 and 25 of the inductor 42.

Figure 4A:
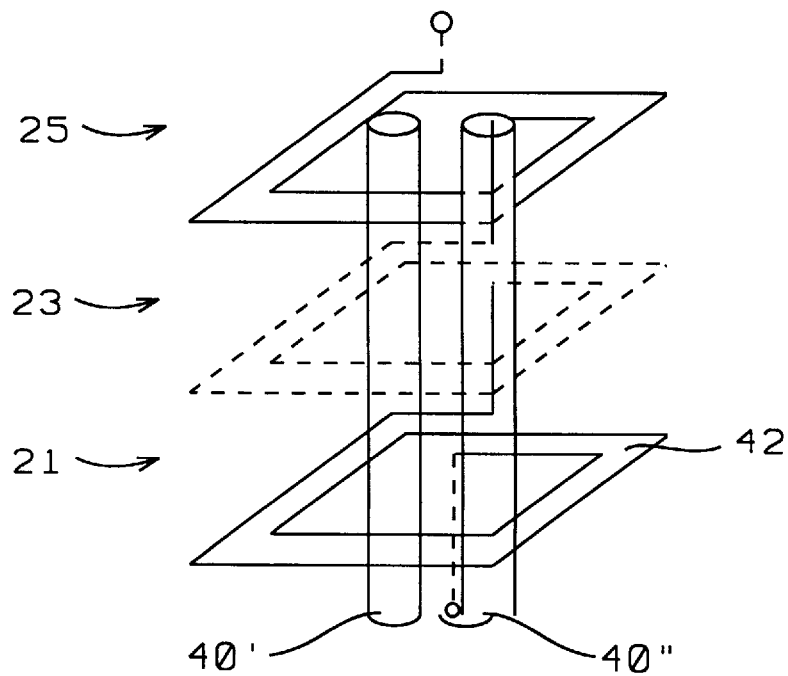
FIGS. 4a and 4b show the creation of multiple capacitors inside an inductor, as follows.
Figure 4B:
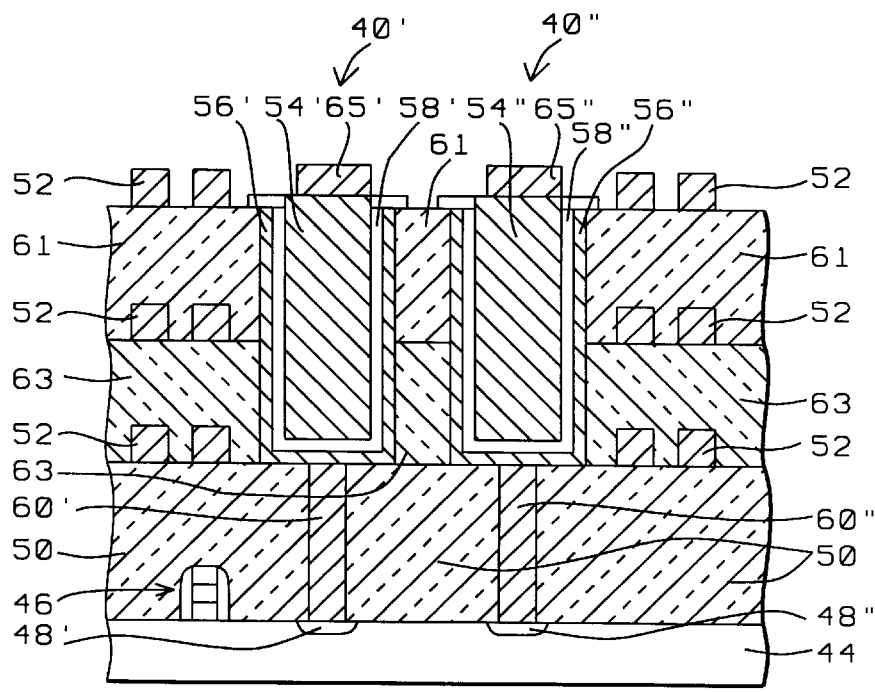

FIG. 4a and 4b show a cross section whereby two capacitors are enclosed within the windings (or coils) of an inductor. The elements that are shown in cross section in these two figures are similar to corresponding elements that have been shown in FIGS. 2a and 2b, as follows for FIG. 4a:

40' and 40" are the two capacitors that have been created enclosed within the windings (or coils) of an inductor
42 is the inductor that encloses the two capacitors 40' and 40"
21, 23 and 25 are the layers of the inductor 42

FIG. 4b shows a cross section of the two capacitors of FIG. 4a that has been created inside a multi-layer spiral inductor. The various elements that are shown in cross-section in FIG. 4b are:

44 is a p-type substrate over the surface of which the inductor 42 and the capacitors 40' and 40" are created
46 is a MOS transistor that has been created on the surface of substrate 44
48' and 48" are points of electrical contact in the surface of substrate 44 to which the bottom electrode of the capacitors 40' and 40" are connected
50 is a layer of dielectric over the surface of which the capacitors 40' and 40" and the inductor 42 are created
52 are the coils of the inductor 42
54' and 54" are the metal plugs of the top electrodes of the capacitor 40' and 40"
56' and 56" are the bottom electrodes of the capacitors 40' and 40"
58' is the dielectric of the capacitor 40', 58" is the dielectric of the capacitor 40"
60' and 60" are the interconnect vias between the bottom electrode 56' and 56" of capacitors 40' and 40" and the points of electrical contact 48' and 48" in the surface of substrate 44
61 and 63 are two overlying layers of dielectric that partially embed the coils 52 of the inductor 42, and
65' and 65" are layers of conducting metal that connect to the top electrodes 54' and 54" of capacitors 40' and 40".

Relating to the cross sections that as shown in FIGS. 4a and 4b, it can be observed that the eddy currents that are created on the walls (i.e. surface or bottom electrode 56' and 56") of the capacitor and that have been highlighted under FIG. 3 have been eliminated using the construction shown in FIGS. 4a and 4b. The eddy currents that are typically induced on the sidewall of a single capacitor that is surrounded by inductor coils are, in the constructions where two capacitors are enclosed by an inductor, interrupted and balanced out due to the presence of the two capacitors. Local potential will be developed on the surface of each of these two capacitors for counter-balancing the eddy currents, resulting in the eddy currents being reduced to zero. This mechanism can be compared with the used of a "patterned ground shield", for eliminating eddy currents in the surface of the substrate, this approach is further discussed in the referenced matter that forms part of the present application.

Further details that relate to the invention are shown in FIGS. 5 through 9.

Figure 5:
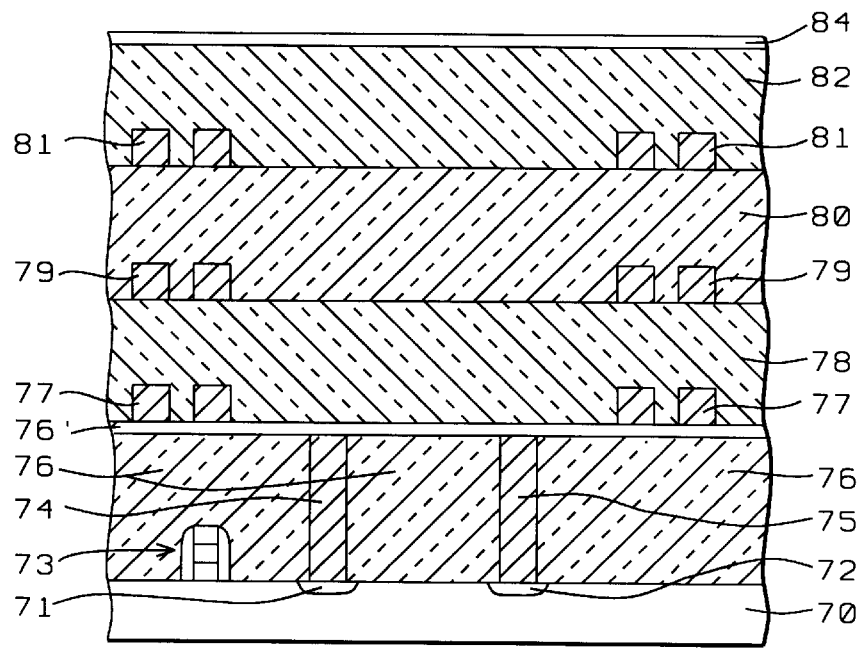
FIGS. 5 through 9 shows further detail relating to the creation of two capacitors that are enclosed by the conducting lines of an inductor, as follow.

Referring now specifically to FIG. 5, there is shown a cross section of a (p-type) semiconductor substrate 70 in or on the surface of which have been created:

71 and 72, $n^+$ doped points (or junctions) in the surface of substrate 70, these points of electrical contact are to be connected to the bottom electrodes of the two capacitors that are created over the surface of substrate 70 and that are enclosed (surrounded by) the conductive coils of an inductor; points 71 and 72 can therefore be connected to separate circuits and may be at different voltage levels; points 71 and 72 may also be $p^+$ doped points and are shorted to the p-type substrate 70 to a common voltage level; finally, points 71 and 72 may be individually, either $n^+$ or $p^+$, doped points 73, a MOS transistor (gate electrode) that has been created using conventional methods on the surface of substrate 70

74 and 75 are two contact plugs that are to be connected to the bottom plate of the two capacitors and that as such form the conductive interface between the bottom plates of the capacitors and the two points 71 and 72 of electrical contact in the surface of substrate 70

76, 78, 80 and 82 are four layers of dielectric on the surface of which the conducting coils of the inductor are created using conventional methods of photolithography patterning and etching for the formation of interconnect lines 76' is a thin layer of silicon nitride which serves as an etch stop layer 77, 79 and 81 are the conducting coils of the inductors that have been created on the surfaces of dielectric layers 76, 78 and 80, and 84, is a thin layer of nitride deposited over the surface of layer 82; this layer 84 of nitride forms an etch stop layer for subsequent processing.

The processing steps that are used for the creation of the structure in FIG. 5 are well known in the art and will therefore not be further highlighted at this time. The material of the invention for the dielectric layers 76, 78 and 80 is typically referred to as Inter Metal Dielectric (IMD) oxide. IMD materials are most preferably silicon oxide, low-k oxide, or organic materials, or carbon or fluorine containing oxide, etc. The preferred thickness of layer 82 is about 1500 to 3000 Angstrom.

Conductive material commonly used for the interconnect plugs 74 and 75 and the coils 77, 79 and 81 of the inductor are metal (Al or Cu), polycide, poly silicon, amorphous silicon or any other semiconductor compatible conductive material (i.e. TiN or TaN). Lines 77, 79 and 81 for the conductor coils are preferred to be a metal with low resistivity (e.g. aluminum, copper, etc.) in order to incur low resistive loss in the coils.

A typical application of a layer of dielectric is depositing a layer of $SiO_2$ using CVD technology at a temperature of lower than about 450 degrees C. The layer 76 of dielectric can be deposited to a thickness (for instance between about 2000 Angstrom and 1 μm) that is adequate to cover the gate 73 and to (slightly) extend above the top surface of the gate electrode 73 and all topology on the chip. Layer 76 is, after it has been deposited, polished using CMP technology. Therefore, layer 76 is preferred to be slightly thicker than layers 78, 80 and 82.

The structure that is shown in cross section in FIG. 5 is therefore created using the following processing steps:

first transistor 73 is created using conventional methods of CMOS processing. Keep in mind that transistor 73 is representative of any number of transistors that may have to be created on the surface of substrate 70. Also, the necessary isolation structures are not shown in FIG. 5, such as LOCOS or STI regions in addition to the source and drain junctions (thereby including points of electrical contact 71 and 72)

next, layer 76, referred to as Polysilicon Metal Dielectric (PMD) is deposited and planarized. Contact plugs 74 and 75 are then formed using conventional methods of photolithographic masking and oxide etching of layer 76 for the creation of openings for the contact plugs 74 and 75. These openings are filled with a conductive material (e.g. tungsten, polysilicon, TiN and the like) that is also deposited on the surface of layer 76. Chemical Mechanical Polishing (CMP) is performed until the conductive material on the surface of layer 76 is removed. It must be noted at this time that the two contact plugs 74 and 75 are created in the layer 76 of PMD. This is indicative of the fact that two capacitors will be formed overlying the surface of substrate 70, these capacitors are to be enclosed by the conductive lines of an inductor next, a thin layer 76' of nitride, with a thickness of about 100 Angstrom, is deposited over the surface of layer 76 to serve as an etch stop layer next, a layer 77 of conductive material is deposited over the surface of layer 76', this layer is patterned and etched to form the pattern of interconnecting lines that are required to form the first layer of the inductor; such a pattern is shown for instance in FIG. 3, layer 21, that in this example contains two loops of inductor 42 on level 21 layer 78 of Inter Metal Dielectric (IMD) is deposited over the surface of layer 76', a via opening (not shown in FIG. 5) is created in this layer 78 of IMD for the interconnection of the patterned layer 77 with the overlying layer 79. Such a via is shown as via 27 in FIG. 1b. The step of the formation of the via opening uses conventional methods of photolithographic patterning (masking) and etching the via opening (not shown in FIG. 5) is filled with a conductive material, preferably by the deposition of a layer of tungsten over the surface of layer 78 of IMD, a CMP or etchback of this layer is performed down to about the surface of layer 78, leaving essentially a deposition of a tungsten via plug that contacts the conductive lines 77; this completes the processing of dielectric layer 78 layer 79 of conducting material is next deposited over the surface of layer 78, this layer 79 is patterned and etched forming the interconnect lines 79 of the inductor layer 80 of IMD is deposited over the surface of layer 78 a via opening (not shown in FIG. 5) is again formed in layer 80 (see via 29, FIG. 1b)

the via opening is filled with preferably tungsten, creating a tungsten via plug that contacts interconnect lines 79; this completes the processing of dielectric layer 80 layer 81 of conducting material is next deposited over the surface of layer 80, this layer is patterned and etched forming the interconnect lines 81 of the inductor layer 82 of IMD is deposited over the surface of layer 80, this to a thickness of about 2000 Angstrom a thin layer 84 of nitride is deposited over the surface of layer 82; this layer of nitride forms an etch stop layer for subsequent processing.

Layers 76' and 84 of silicon nitride ($Si_3Ni_4$) can be deposited using plasma enhanced CVD (PECVD) methods, at a temperature of less than 450 degrees C., to a thickness of about 100 Angstrom (for layer 76') and 500 Angstrom (for layer 84). Such methods are well known in the art of semiconductor processing.

This completes the processing that is required to create the structure of FIG. 5. It must be noted at this point that the area in which the vertical capacitors are to be created, that is the area overlying the surface of layer 76 and bounded by the interconnect coils 77, 79 and 81 of the inductor, contains only IMD oxide overlying contact plugs 74 and 75.

Figure 6:
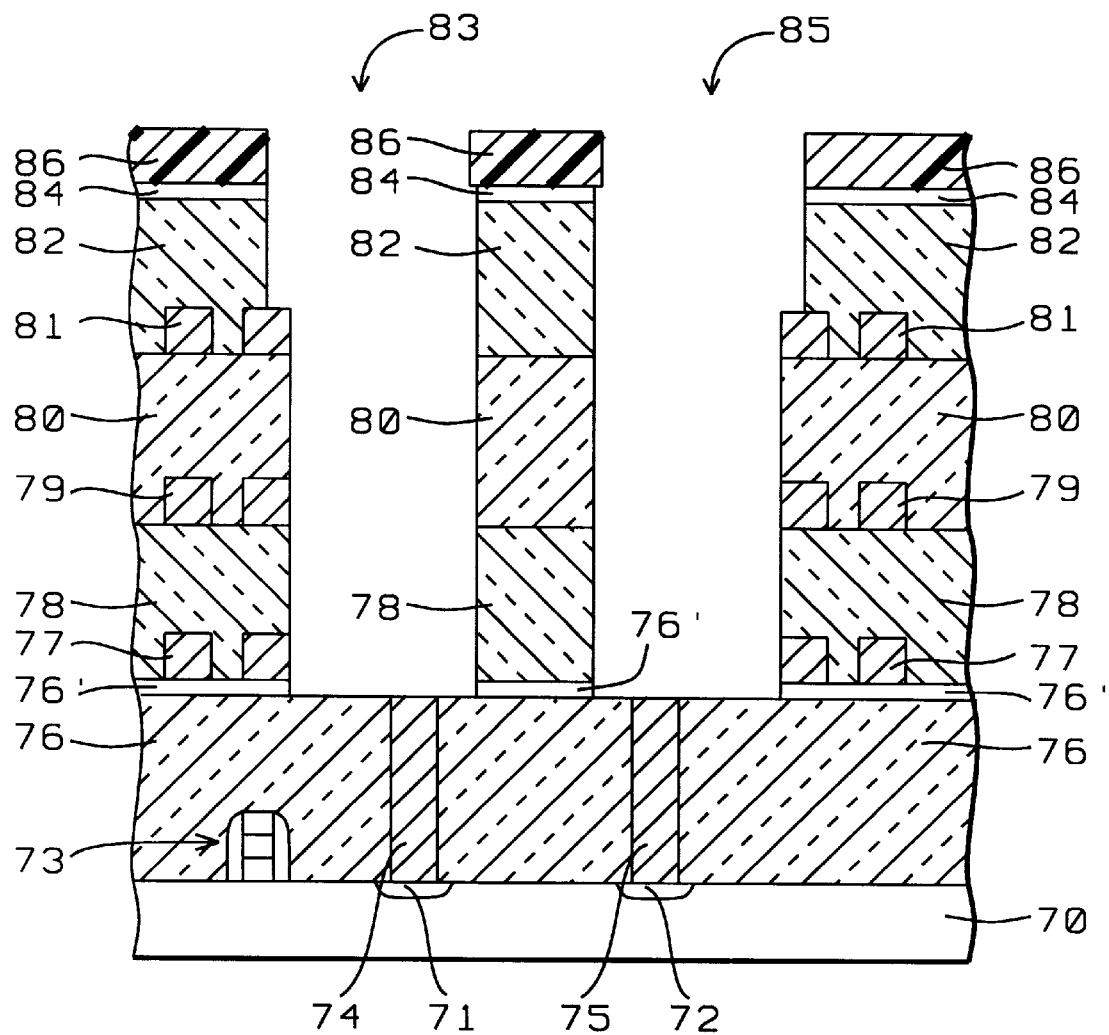

The cross section that is shown in FIG. 6 shows the structure of FIG. 5 after the openings 83 and 85 have been etched through the layers 84 (of nitride), 82, 80 and 78 (of IMD) and 76' (of nitride). This process of etching the indicated layers exposes the surface of contact plugs 74 and 75. Please note (FIG. 6) that the etch for openings 83 and 85 creates openings with sidewalls that partially expose the inner interconnect coils of layer 81 (i.e. no IMD in place between the sidewalls of the openings 83 and 85 and the inner coils of interconnect lines 77 and 79). For the etch of the layers 84 (of nitride), 82, 80, 78, and 76' (of nitride) a layer 86 of photoresist is spun on the surface of the layer 84 of nitride. This layer 86 of photoresist is patterned as indicated in FIG. 6 and remains in place essentially overlaying the interconnect lines 81 and a region of the surface of layer 84 and 82, so that the layers of nitride and IMD can be removed (by plasma etching with high selectivity of nitride and IMD material with respect to the coils of metal) while leaving the layers 77, 79 and 81 of the inductor coils undisturbed. The etching of the layers 84, 82, 80 78 and 76' sequentially continues to the point where the surface of the contact plugs 74 and 75 is exposed. The cross section of FIG. 6 shows that the two openings 83 and 85 are self-aligned with respect to the coils 77, 79 and 81 of the inductor.

The layer 76' of thin silicon nitride is then selectively etched by plasma etch, using $CHF_3$ or $SF_6$-$O_2$ as main etchant.

Figure 7:
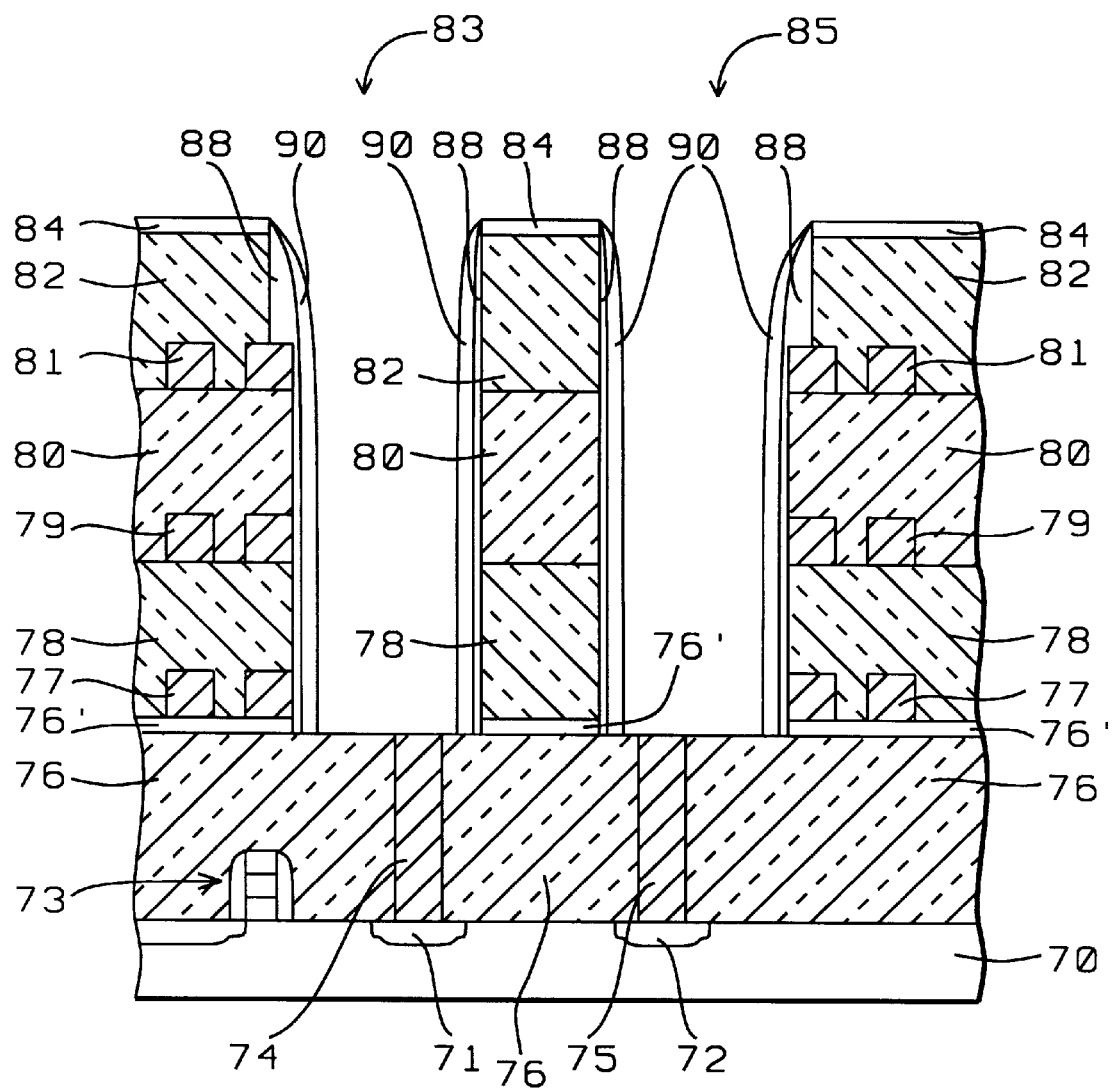

FIG. 7 shows a cross section of the openings for the capacitor whereby the sidewalls of the openings 83 and 85 are lined with spacers 88 and 90. As a first step in the process, the patterned layer 86 (FIG. 6) of photoresist is removed using conventional methods e.g. organic solvent and/or plasma stripping of resist. Note that the photoresist layer 86 at this step cannot be removed by wet acids (e.g. $H_2SO_4$) since the inductor coils are exposed and will be attacked by acids.

After the photoresist (layer 86, FIG. 6) has been removed, spacer 88 is formed over the sidewalls of openings 83 and 85 by depositing a thin (about 500 Angstrom) layer of oxide over the surface of the structure and by performing an etch-back of this layer of oxide. The spacer material 88 that has been deposited is etched back from all regions others than the sidewalls of the openings. This is achieved by applying an anisotropic plasma dry etchback that removes vertically the spacer material 88 from the top and only leaves spacer material 88 in place where it has the largest thickness from the top, that is on the sidewalls of the openings 83 and 85. The deposited oxide is therefore also removed from the surface of the contact plugs 74 and 75, the deposited layer of oxide is also removed from the surface of the thin layer 84 of silicon nitride. Layer 84 (nitride) also serves as an etch stop (providing end-point signal) of the oxide etch back step. The preferred spacer materials for this step are silicon oxide, BSG, PSG, or other low-k materials preferably of a dielectric nature.

The above process of forming a first spacer layer 88 is repeated for the formation of a second spacer layer 90, in this case the originally deposited layer of oxide is about 700 Angstrom thick. The double layers of spacer are deposited in order to insulate the inductor coils 81, 79 and 77 in the sidewalls of the openings 83 and 85 from conducting materials that are to be deposited inside openings 83 and 85 for the bottom electrode of the capacitor. The etch of the second layer of oxide again removes the deposited second layer of oxide from the surface of the contact plugs 73 and 75, exposing these surfaces. The etch of the second layer of oxide further removes this second layer from the surface of the thin layer 84 of silicon nitride which again serves as an etch-stop layer. The second spacer process is important especially when coils 81, 79 and 77 are not perfectly aligned (in the vertical direction) with each other due to lithography limitations.

Figure 8:
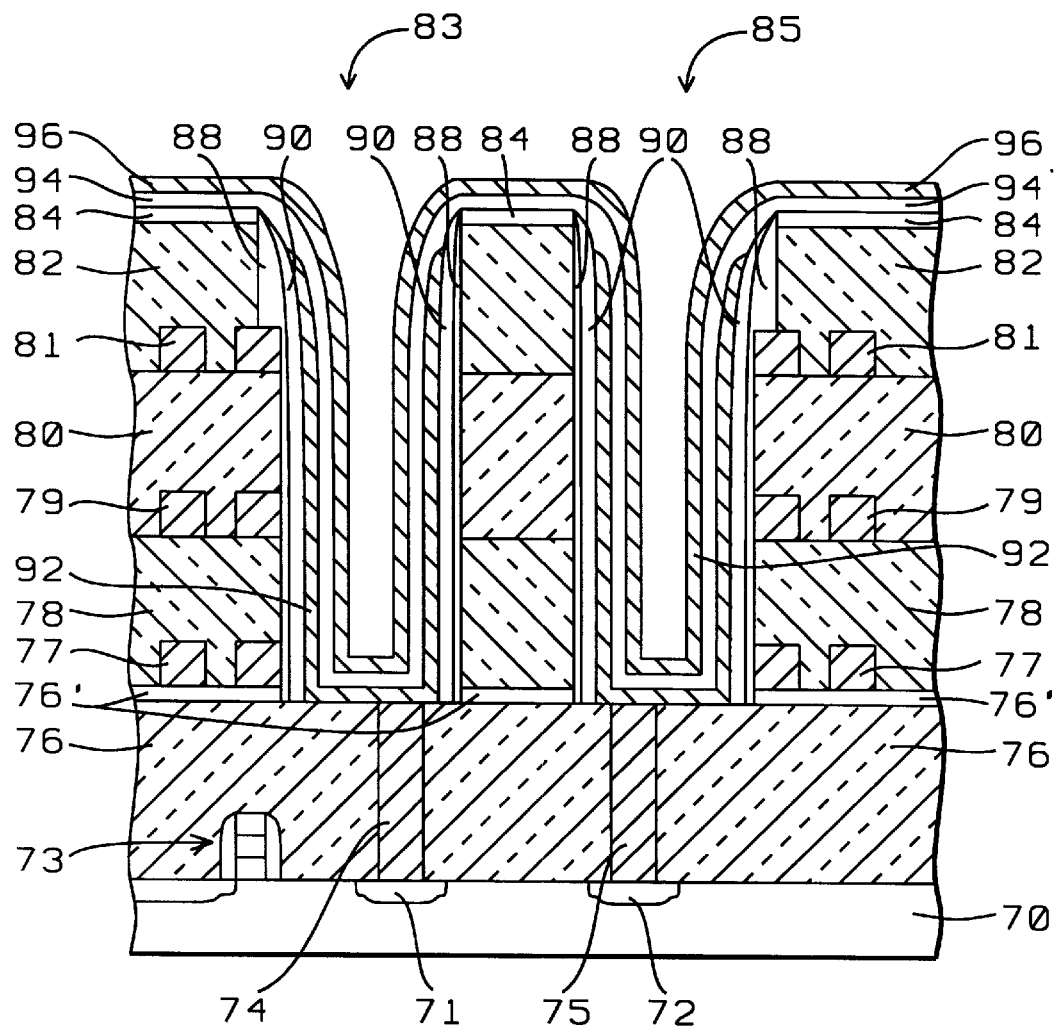

FIG. 8 shows the steps for the creation of two vertical capacitors, the preferred material for the bottom electrode of the capacitor is Ti/TiN or Ti/TaN, the preferred material for the top electrode of the capacitors is TiN/Ti or Ti/TaN, the preferred material for the dielectric of the capacitors is $Ta_2O_5$. With this in mind, the vertical capacitors are formed following the steps of:

performing a conformal CVD deposition of a the bottom electrode of conductive material 92 of Ti/TiN or Ti/TaN to a thickness of 100 Angstrom each over the surface of the structure, that is the bottom and sidewalls of the openings 83 and 85 and the surface of the thin layer 84 of silicon nitride that remains in place overlying the layer 82 of IMD. Ti is preferably deposited by CVD methods at a low temperature (less than 450 degrees C.) and TiN or TaN is also deposited by CVD methods at low temperatures. Both Ti and TiN (or TaN) can be deposited using individual chambers attached to the same equipment platform. This stack of Ti/TiN or Ti/TaN layer 92 makes contact with the surfaces of the contact plugs 74 and 75.

the openings 83 and 85 are filled with photoresist (not shown in FIG. 8) to form a protective layer for a subsequent etch, this layer of photoresist also overlays the thin layer 92 of Ti/TiN or Ti/TaN that has been deposited over the layer 84 of nitride.

the surface of the deposited layer of photoresist is polished using methods of CMP, the deposited layer 92 of Ti/TiN or Ti/TaN that overlies the stop layer 84 is also polished (removed) whereby the thin layer 84 of nitride is the CMP stop layer and exposed by this process of CMP. After this process of CMP, the conducting bottom electrode material layer of Ti/TiN remains in place inside each of the openings 83 and 85 (protected by the overlying layer of photoresist), however these layers are also not shorted together. The CMP process therefore provides a method to isolate the capacitor bottom electrodes 92.

then, before removing the photoresist inside the openings 83 and 85, a plasma etching of the layer 92 of Ti/TiN or Ti/TaN around the upper perimeter is performed, this is referred to as a recess etch, the Ti/TiN or Ti/TaN (that is the material of the bottom electrode of the capacitor) is etched slightly (about 200 Angstrom) away from the upper perimeter of the openings 83 and 85, creating a slight recess of the bottom plate (of the capacitor) away from the upper perimeter of the openings 83 and 85. This is important as a reliability concern since undue stress can be created in the overlying layers due to the sharp curvature of these layers. The removal of the Ti/TiN or Ti/TaN reduces this curvature and thereby reduces the stress in the overlying layers (the dielectric and the top electrode of the capacitors), the recess etch further removes potential problems of shorts between the bottom electrode 92 and the thereover deposited top electrode of the capacitor.

the photoresist is then removed from openings 83 and 85 using plasma or organic stripping methods, the surface is thoroughly cleaned to remove any remaining photoresist, the surface of the bottom layer of Ti/TiN or Ti/TaN of the capacitor is exposed by the removal of the photoresist from openings 83 and 85.

a layer 94 of $Ta_2O_5$ is next deposited over the exposed layer of Ti/TiN or Ti/TaN and over the surface of the exposed layer 84 of silicon nitride to a thickness between about 200 and 500 Angstrom, this forms the dielectric layer of the capacitors.

a stack of layer 96 of TiN/Ti or TaN/Ti is conformally deposited to a thickness of between about 100 Angstrom each over the surface of the deposited layer 92 of dielectric, layer 96 forms the top electrode of the capacitors.

Layers 92 and 96 for the bottom and top electrodes of the capacitor may be deposited by reactive sputtering but are more preferably deposited by CVD methods for conformal deposition. For instance, layers of TiN and Ti can be sequentially deposited using $TiCl_4$ based CVD in each individual chamber but integrated in the same equipment in a temperature lower than 450 degrees C. to a thickness of between about 50 and 200 Angstrom.

Figure 9:
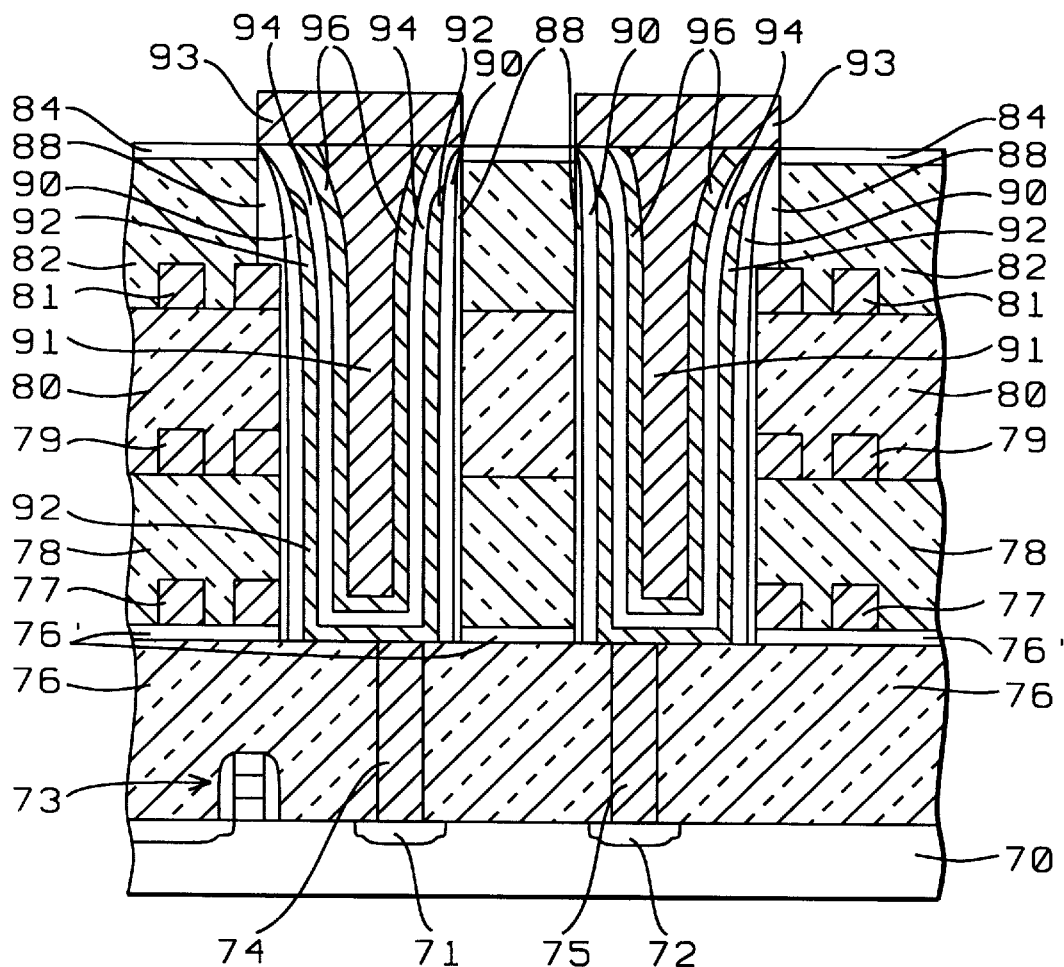

The final processing steps in the creation of two capacitors that are surrounded by the coils of an inductor are shown in FIG. 9 where:

via openings (not shown in FIG. 9) are formed in layer 82 by typical masking and etching steps for interconnect metal layer 81 (also used as inductor coils)

openings 83 and 85 as well as via openings in layer 82 are then filled with metal 91 (e.g. tungsten of copper), the surface of the deposited metal 91 is CMP polished down to the surface of layer 96 of TiN/Ti or Ti/TaN, and continuously polishing down to the surface of layer 84 (FIG. 8) of etch stop material. Note that the conducting material Ti/TiN or Ti/TaN, layer 92, does not exist on the surface of 84 layer 84, after serving as etch-stop for spacer etch-back and CMP, is now removed by plasma nitride etching metal layer 93 is then deposited, for interconnecting the capacitors. The contact pads 93 remain, after the patterning and etching of layer 93, in contact with the top electrode 96 of the capacitors. As a result of the previously highlighted recess etch, the contact pads 93 are above but do not contact the underlying bottom electrode 92 (FIG. 9) of the capacitors.

From the above highlighted procedure and the thereby accompanying drawings, it is clear that the invention has provided a process for the creation of two capacitors inside the coils of an inductor. It is clear that where the above description has shown for instance three layers of coils of the inductor, the invention is not limited to three layers or to a particular number of windings in each of the layers of coils of the inductor. In addition, it is clear from the above that the invention can readily be extended where the examples that have been described can readily be extended to where more than two capacitors can be created inside the coils of an inductor. There is nothing in the instant invention that limits the length of the conducting lines that from the coils of the inductor, there is therefore nothing in the invention that limits the area that is surrounded by the coils of the inductor from which follows that a large surface area can be made is available for the creation of more than two openings from where more than two capacitors can be created. The invention thereby places no limit on the number of capacitors that can be created in this manner, if and where limits apply these limits are imposed by limitations of electrical performance and perhaps, although less clearly so, by processing limits.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method for the creation of at least two vertical capacitors inside a spiral inductor for high-frequency and mixed digital and analog applications, comprising the steps of:

providing a semiconductor substrate, said substrate having been provided with at least one MOS device on the surface thereof, contact points to said at least one MOS device having been provided in the surface of said substrate, a first layer of dielectric having been deposited over the surface of said substrate, including the surface of said at least one MOS device and said contact points, at least two conductive contact plugs having been formed through said first layer of dielectric contacting said contact points provided in said surface of said substrate, said at least two contact plugs forming contacts for a bottom electrode of overlying at least two capacitors, the surface of said first layer of dielectric having been polished;

depositing a first etch stop layer comprising silicon nitride over the surface of said first layer of dielectric;

creating a multi-layered inductor on the surface of said first layer of dielectric in multiple layers of dielectric, each layer of said multi-layered inductor comprising at least one coil of said inductor created by depositing a layer of metal for each layer of said inductor and patterning and etching said layer of metal, forming coils for said layer, said each layer further comprising depositing a layer of dielectric, creating a via plug in said layer of dielectric, said via plug interconnecting said at least one coil for said layer with an adjacent, overlying layer of coils, whereby no via plug is created in an upper layer of said multiple layers of dielectric;

depositing a second etch stop layer comprising silicon nitride over the surface of a layer of dielectric containing an upper layer of coils of said inductor, said second etch stop layer deposited to a thickness of about 500 Angstrom;

etching said second etch stop layer and said multiple layers of dielectric containing said multi-layer inductor and said first etch stop layer down to the surface of said first layer of dielectric using plasma etching with high selectivity of nitride and IMD with respect to the metal for each layer of said inductor, creating at least two openings having sidewalls further having a bottom surface through said second etch stop layer and said multiple layers of dielectric and said first etch stop layer, said at least two openings aligning with said at least two via plugs created in said first layer of dielectric, exposing the surface of said at least two via plugs, said at least two openings partially exposing inner coils of said inductor, said at least two openings being surrounded by said coils of said inductor;

depositing a double layer of spacers over the surface of said sidewalls of said at least two openings;

depositing a layer of Ti/TiN or Ti/TaN over the surface of said double layer of spacers and said bottom surface of said at least two openings, including the surface of said second etch stop layer, forming a bottom electrode of said at least two capacitors;

removing said layer of Ti/TiN or Ti/TaN from the surface of said second etch stop layer, further removing said layer of Ti/TiN or Ti/TaN from around an upper perimeter of said at least two openings by performing a recess etch, creating a recessed bottom electrode having a surface, exposing the surface of said second etch stop layer;

depositing a layer of $Ta_2O_5$ over the surface of said recessed bottom electrode, including the surface of said second etch stop layer, forming a layer of dielectric of said at least two capacitors;

depositing a layer of TiN/Ti or TaN/Ti over the surface of said layer of $Ta_2O_5$, forming a layer of top electrode of said at least two capacitors;

depositing a first layer of metal over the surface of said layer of TiN/Ti or TaN/Ti;

removing said first layer of metal and said deposited layer of TiN/Ti or TaN/Ti and said layer of $Ta_2O_5$ from above the surface of said second etch stop layer using methods of CMP and from above said at least two openings aligning with said at least two via plugs created in said first layer of dielectric, leaving in place a layer of said first layer of metal having a surface and filling said at least two openings aligning with said at least two via plugs created in said first layer of dielectric;

removing said second etch stop layer from the surface of said layer of dielectric containing an upper layer of coils of said inductor;

depositing a second layer of metal over the surface of said layer of dielectric containing an upper layer of coils of said inductor and the surface of said first layer of metal filling said at least two openings; and patterning and etching said second layer of metal, forming at least two contact pads for said contacting said top electrodes of said at least two capacitors.

2. The method of claim 1, said at least two conductive contact plugs having been formed through said first layer of dielectric comprising tungsten or doped polysilicon.

3. The method of claim 1, said depositing double layer of spacers over the surface of said sidewalls of said at least two openings comprising the steps of:

depositing a first layer of oxide to a thickness of about 500 Angstrom over inside surfaces of said at least two openings, including the surface of said etch stop layer;

anisotropic etching said first layer of oxide, leaving said oxide in place overlying said sidewalls of said at least two openings, creating first spacers over the sidewalls of said at least two openings, removing said first layer of oxide from the surface of said etch stop layer;

depositing a second layer of oxide over the surface of said first spacer to a thickness of about 700 Angstrom, including depositing said second layer of oxide over the surface of said etch stop layer; and anisotropic etching said second layer of oxide, leaving said oxide in place overlying said first spacers over said sidewalls of said at least two openings, creating second spacers overlying said first spacers over the sidewalls of said at least two openings, removing said second layer of oxide from the surface of said etch stop layer.

4. The method of claim 1, said depositing a layer of Ti/TiN or Ti/TaN over the surface of said double layer of spacers comprising depositing a layer of Ti/TiN or Ti/TaN deposited to a thickness between about 50 and 200 Angstrom.

5. The method of claim 1, said depositing a layer of $Ta_2O_5$ over the surface of said recessed bottom electrode comprising a layer of $Ta_2O_5$ deposited to a thickness between about 100 and 500 Angstrom.

6. The method of claim 1, said depositing a layer of TiN/Ti or TaN/Ti over the surface of said layer of $Ta_2O_5$ comprising a layer of TiN/Ti or TaN/Ti deposited to a thickness between about 50 and 200 Angstrom.

7. The method of claim 1, said removing said layer of Ti/TiN or Ti/TaN from the surface of said second stop layer, further removing said layer of Ti/TiN or Ti/TaN from around the upper perimeter of said at least two openings by performing a recess etch, creating a recessed bottom electrode, exposing the surface of said layer of etch stop, comprises the steps of:

filling said at least two openings etched in said multiple layers of dielectric containing said multi-layer inductor with a layer of photoresist;

polishing the surface of said layer of photoresist and said layer of Ti/TiN or Ti/TaN using methods of Chemical Mechanical Polishing (CMP), using said second etch stop layer as a stop layer for said process of CMP, exposing the surface of said second etch stop layer;

etching said layer of Ti/TiN or Ti/TaN around an upper periphery of said at least two openings etched in said multiple layers of dielectric, removing about 200 Angstrom of said layer of Ti/TiN or Ti/TaN from around said periphery, leaving a layer of Ti/TiN or Ti/TaN in place overlaying said double layer of spacers;

removing said layer of photoresist, exposing Ti/TiN or Ti/TaN overlaying said double layer of spacers; and additionally removing photoresist by thoroughly cleaning the surface of said exposed Ti/TiN or Ti/TaN overlaying said double layer of spacers in addition to the surface of said second etch stop layer.

8. The method of claim 1, said first etch stop layer comprising silicon nitride, preferably deposited to a thickness between about 50 and 150 Angstrom and more preferably deposited to a thickness of about 100 Angstrom.

9. The method of claim 1, said upper layer of said multiple layers of dielectric being deposited to a thickness of between about 1500 and 2500 Angstrom.

10. The method of claim 1, said multiple layers of dielectric comprising Inter Metal Dielectric oxide.

11. A method for the creation of at least two vertical capacitors inside a spiral inductor for high-frequency and mixed digital and analog applications, comprising the steps of:

providing a semiconductor substrate, said substrate having been provided with at least one MOS device on the surface thereof, at least two contact junctions having been provided in the surface of said substrate, said at least two contact junctions being contact junctions to which bottom electrodes of at least two vertical capacitors to be created on the surface of said substrate are being connected, a base layer of dielectric having been deposited over the surface of said substrate, including the surface of said at least two contact junctions, at least two conductive contact plugs having been formed through said base layer of dielectric contacting said at least two contact junctions provided in said surface of said substrate, said at least two contact plugs forming contacts for a bottom electrode of overlying at least two capacitors, the surface of said base layer of dielectric having been polished;

depositing a first etch stop layer of the surface of said base layer of dielectric;

depositing a first layer of conductive material over the surface of said first etch stop layer;

patterning and etching said first layer of conductive material, forming a first pattern of interconnect lines on the surface of said first etch stop layer, said first pattern of interconnect lines comprising a first layer of coils of said spiral inductor;

depositing a first layer of dielectric over the surface of said first etch stop layer, including the surface of said first pattern of interconnect lines;

creating a first via in said first layer of dielectric, said first via being aligned with and contacting said first layer of interconnect lines;

depositing a second layer of conductive material over the surface of said first layer of dielectric;

patterning and etching said second layer of conductive material, forming a second pattern of interconnect lines on the surface of said first layer of dielectric, said second pattern of interconnect lines comprising a second layer of coils of said spiral inductor;

depositing a second layer of dielectric over the surface of said first layer of dielectric, including the surface of said second pattern of interconnect lines;

creating a second via in said second layer of dielectric, said second via providing an electrical connection between said second pattern of interconnect lines and an adjacent, overlying pattern of interconnect lines;

depositing a third layer of conductive material over the surface of said second layer of dielectric;

patterning and etching said third layer of conductive material, forming a third pattern of interconnect lines on the surface of said second layer of dielectric, said third pattern of interconnect lines comprising a third layer of coils of said spiral inductor;

depositing a third layer of dielectric over the surface of said second layer of dielectric, including the surface of said third pattern of interconnect lines, said third layer of interconnect lines making electrical contact with said second via created in said second layer of dielectric, said third layer of dielectric being an upper layer of dielectric;

depositing a second etch stop layer over the surface of said third layer of dielectric;

etching said second etch stop layer, creating at least two openings in said second etch stop layer, said at least two openings being aligned with said at least two conductive contact plugs provided in said base layer of dielectric;

etching said third, second, first layers of dielectric and said first etch stop layer in accordance with said at least two openings created in said second etch stop layer, creating at least two openings having sidewalls further having a bottom surface in said third, second, first layer of dielectric and said first etch stop layer, said at least two openings being surrounded by coils comprising said first, second and third layer of coils of said spiral conductor, said etching partially exposing inner coils of said first, second and third layer of coils of said spiral conductor, continuing said etching to the point of exposing the surface of said at least two conductive contact plugs created in said base layer of dielectric;

creating double layered spacers on the sidewalls of said openings created in said first, second, third layer of dielectric and said first etch stop layer;

conformally depositing a layer of Ti/TiN or Ti/TaN over the surface of said double layered spacers on the sidewalls of said at least two openings created in said first, second, third layer of dielectric and said first etch stop layer and over said bottom surface of said at least two openings, including the surface of said second etch stop layer;

removing said layer of Ti/TiN or Ti/TaN from the surface of said second etch stop layer, exposing the surface of said second etch stop layer, further removing said layer of Ti/TiN or Ti/TaN from the surface of said double layered spacers around an upper perimeter of said at least two openings created in said first, second, third layer of dielectric and said first etch stop layer, partially exposing said double layered spacers, partially leaving said layer of Ti/TiN or Ti/TaN in place overlying said double layered spacers, leaving said layer of Ti/TiN or Ti/TaN in place overlying said bottom surface of said at least two openings;

depositing a layer of $Ta_2O_5$ over the surface of said second etch stop layer, including said layer of Ti/TiN or Ti/TaN in place overlying said double layered spacers, including the surface of said partially exposed double layered spacers, including said bottom surface of said at least two openings;

conformally depositing a layer of TiN/Ti of TaN/Ti over the surface of said layer of $Ta_2O_5$;

depositing a first layer of conductive material over the surface of said layer of TiN/Ti of TaN/Ti, filling said at least two openings with said conductive material;

removing said first layer of conductive material from above said second etch stop layer including from above said at least two openings by applying methods of CMP, using said second etch stop layer of the top layer for said CMP, leaving in place a layer of said first layer of metal having a surface and filling said two openings;

removing said second etch stop layer from above the surface of said third layer of dielectric;

depositing a second layer of conductive material over the surface of said second etch stop layer and the surface of said layer of said first layer of metal filling said two openings; and patterning and etching said second layer of conductive material, creating at least two contact points to said at least two vertical capacitors, said at least two contact points overlying said at least two openings created in said first, second, third layer of dielectric and said first etch stop layer, removing said second layer of conductive material from the surface of said third layer of dielectric.

12. The method of claim 11, said layers of coils of said spiral inductor being limited to one layer of coils, said limitation being implemented by eliminating said steps of depositing a first layer of dielectric up through and including said step of creating a second via in said second layer of dielectric.

13. The method of claim 11, said layers of coils of said spiral inductor being limited to two layers of coils, said limitation being implemented by eliminating said steps of depositing a first layer of dielectric up through and including said step of creating a first via in said first layer of dielectric.

14. The method of claim 11, said layers of coils of said spiral inductor being extended to multiple layers of coils, said extension being implemented by repetitive cycles of depositing a layer of conductive material, patterning and etching said layer of conductive material, depositing a layer of dielectric followed by creating a via in said layer of dielectric, said multiple layers of coils being formed prior to said depositing said upper layer of dielectric.

15. The method of claim 11, said at least two conductive contact plugs having been formed through said base layer of dielectric comprising tungsten.

16. The method of claim 11, said creating double layered spacers on the sidewalls of said openings created in said first, second and third layer of dielectric comprising the steps of:
   depositing a first layer of oxide to a thickness of about 500 Angstrom over inside surfaces of said at least two openings created in said first, second, third layer of dielectric and said second etch stop layer;
   etching said first layer of oxide, leaving said first layer of oxide in place overlying sidewalls of said at least two openings, creating first spacers over sidewalls of said at least two openings, removing said first layer of oxide from the surface of said second etch stop layer, further removing said first layer of oxide from said bottom surface of said at least two openings;
   depositing a second layer of oxide over the surface of said first spacers to a thickness of about 700 Angstrom, including depositing said second layer of oxide over the surface of said second etch stop layer, including depositing said second layer of oxide over said bottom surface of said at least two openings and
   etching said second layer of oxide, leaving said second layer of oxide in place overlying said sidewalls of said at least two openings, creating second spacers overlying said first spacers over the sidewalls of said at least two openings, removing said second layer of oxide from the surface of said second etch stop layer, further removing said second layer of oxide from said bottom surface of said at least two openings.

17. The method of claim 11, said conformally depositing a layer of Ti/TiN or Ti/TaN over the surface of said double layered spacers on the sidewalls of said at least two openings comprising a layer of Ti/TiN or Ti/TaN deposited to a thickness between about 10 and 100 Angstrom.

18. The method of claim 11, said depositing a layer of $Ta_2O_5$ comprising a layer of $Ta_2O_5$ deposited to a thickness between about 200 and 500 Angstrom.

19. The method of claim 11, said conformally depositing a layer of TiN/Ti or TaN/Ti over the surface of said layer of $Ta_2O_5$ comprising a layer of TiN/Ti or TaN/Ti deposited to a thickness between about 10 and 100 Angstrom.

20. The method of claim 11, said removing said layer of Ti/TiN or Ti/TaN from the surface of said etch stop layer, exposing the surface of said etch stop layer, further removing said layer of Ti/TiN or Ti/TaN from the surface of said double layered spacers around an upper perimeters of said at least two openings comprises the steps of:
   filling said at least two openings etched in said multiple layers of dielectric containing said multi-layer inductor with a layer of photoresist;
   polishing the surface of said layer of photoresist and said layer of Ti/TiN or Ti/TaN using methods of Chemical Mechanical Polishing (CMP), using said second etch stop layer as a stop layer for said process of CMP, exposing the surface of said second etch stop layer;
   etching said layer of Ti/TiN or Ti/TaN around an upper periphery of said at least two openings etched in said multiple layers of dielectric, removing about 200 Angstrom of said layer of Ti/TiN or Ti/TaN around said periphery, leaving a layer of Ti/TiN or Ti/TaN in place overlaying said double layer of spacers;
   removing said layer of photoresist, exposing Ti/TiN or Ti/TaN overlaying said double layer of spacers; and
   additionally removing photoresist by thoroughly cleaning the surface of said exposed Ti/TiN or Ti/TaN overlaying said double layer of spacers in addition to the surface of said etch stop layer.

21. The method of claim 11, said first etch stop layer comprising silicon nitride, deposited to a thickness preferably between about 150 and 250 Angstrom and more preferably of about 100 Angstrom.

22. The method of claim 11, said upper layer of said multiple layers of dielectric being deposited to a thickness of between about 1500 and 2500 Angstrom.

23. The method of claim 11, said first, second and third layers of dielectric comprising Inter Metal Dielectric oxide.

* * * * *